United States Patent [19]
Chen et al.

[11] Patent Number: 5,386,380
[45] Date of Patent: Jan. 31, 1995

[54] BYPASS SCHEME FOR ROM IC

[75] Inventors: Hsin-Li Chen, Hsin-Chu; Han-Shen Lo, Chu-Pei; Wood Wu, Hsin-Chu, all of Taiwan, Prov. of China

[73] Assignee: United Microelectronics Corporation, Hsin-Chu, Taiwan, Prov. of China

[21] Appl. No.: 95,261

[22] Filed: Jul. 21, 1993

[51] Int. Cl.[6] .......................................... G11C 17/00
[52] U.S. Cl. ........................... 365/94; 365/200
[58] Field of Search ............. 365/94, 95, 200, 189.01; 371/10.1

[56] References Cited
U.S. PATENT DOCUMENTS

| | | | |
|---|---|---|---|
| 5,034,925 | 7/1991 | Kato | 365/200 |
| 5,124,948 | 6/1992 | Takizawa | 365/94 |
| 5,195,057 | 3/1993 | Kasa | 365/200 |

*Primary Examiner*—Eugene R. LaRoche
*Assistant Examiner*—A. Zarabian
*Attorney, Agent, or Firm*—Meltzer, Lippe, Goldstein, Wolf, Schlissel & Sazer

[57] ABSTRACT

A ROM IC includes an extra bit line. The extra bit line outputs a first binary logic signal when a word line in a no-use area is attempted to be read and a second binary logic signal when a word line in a use area is attempted to be read. The output of the extra bit line overrides the normal output of the ROM when a word line in a no-use area is attempted to be read, so that the output of a read operation in the no-use area is always a predetermined binary value. This predetermined binary output value occurs in spite of the fact that because of a defect the actual logic value of a storage location in the word line to be read in the no-use area is other than a desired value. When a word line in the use area is read, the output of the extra bit line does not override the actual binary value stored in the word line. Using the extra bit line and associated override circuitry, a ROM IC with a few defects in a no-use area may still be used in an application. It should be noted that the addition of the extra bit line in the ROM does not significantly increase the amount of chip "real estate" occupied by the ROM.

7 Claims, 2 Drawing Sheets

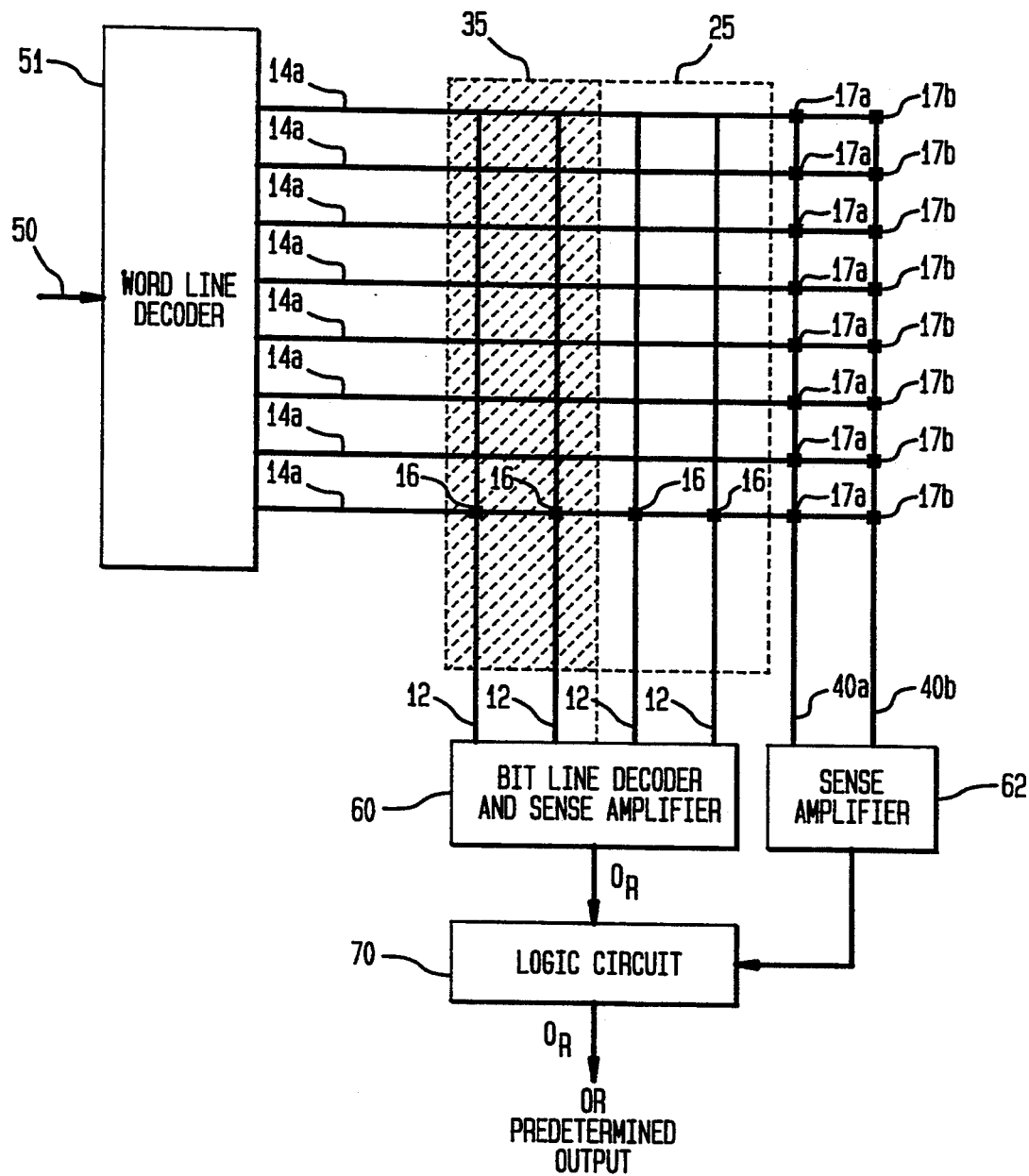

BYPASS SCHEME FOR ROM IC

FIELD OF THE INVENTION

The present invention relates to a Read Only Memory (ROM) Integrated Circuit (IC). In particular, the present invention relates to circuitry which can be used with a ROM to by-pass a "no-use" area when the ROM is read. This permits ROM ICs with defects in the "no-use" area to be utilized in real applications.

BACKGROUND OF THE INVENTION

Generally, the whole memory size in a ROMIC, especially, a high density ROMIC is not fully used in most applications. The area of a ROM memory which is not used in an application is referred to herein as a "no-use" area. In general if a process defect or other influence produces a few defective bit storage locations in the ROM chip, even in the no-use area, the chip will be failed in normal testing procedures. This will pull down the effective yield of a ROMIC fab. However, in a real application, a ROMIC with a few defects at storage locations in a no-use area can still be used. It is an object of the present invention to provide a ROM with circuitry for bypassing a no-use area so the no-use area will not be read during testing or during use in an application and so that the ROM can still be used despite the presence of defects at one or more storage locations in the no-use area.

SUMMARY OF THE INVENTION

The ROM IC, in accordance with the present invention, includes an extra bit line. The extra bit line outputs a first binary logic signal when a word line in a no-use area is attempted to be read and a second binary logic signal when a word line in a use area is attempted to be read. The output of the extra bit line overrides the normal output of the ROM when a word line in a no-use area is attempted to be read, so that the output of a read operation in the no-use area is always a predetermined binary value. This predetermined binary output value occurs in spite of the fact that because of a defect, the actual logic value of a storage location in the word line to be read in the no-use area is other than a desired value. When a word line in the use area is read, the output of the extra bit line does not override the actual binary value stored in the word line. Using the extra bit line and associated override circuitry, a ROM IC with a few defects in a no-use area may still be used in an application. It should be noted that the addition of the extra bit line in the ROM does not significantly increase the amount of chip "real estate" occupied by the ROM.

BRIEF DESCRIPTION OF THE DRAWING

FIG. 2 schematically illustrates a ROM according to a second embodiment of the present invention.

DETAILED DESCRIPTION OF THE INVENTION

Figure 1:
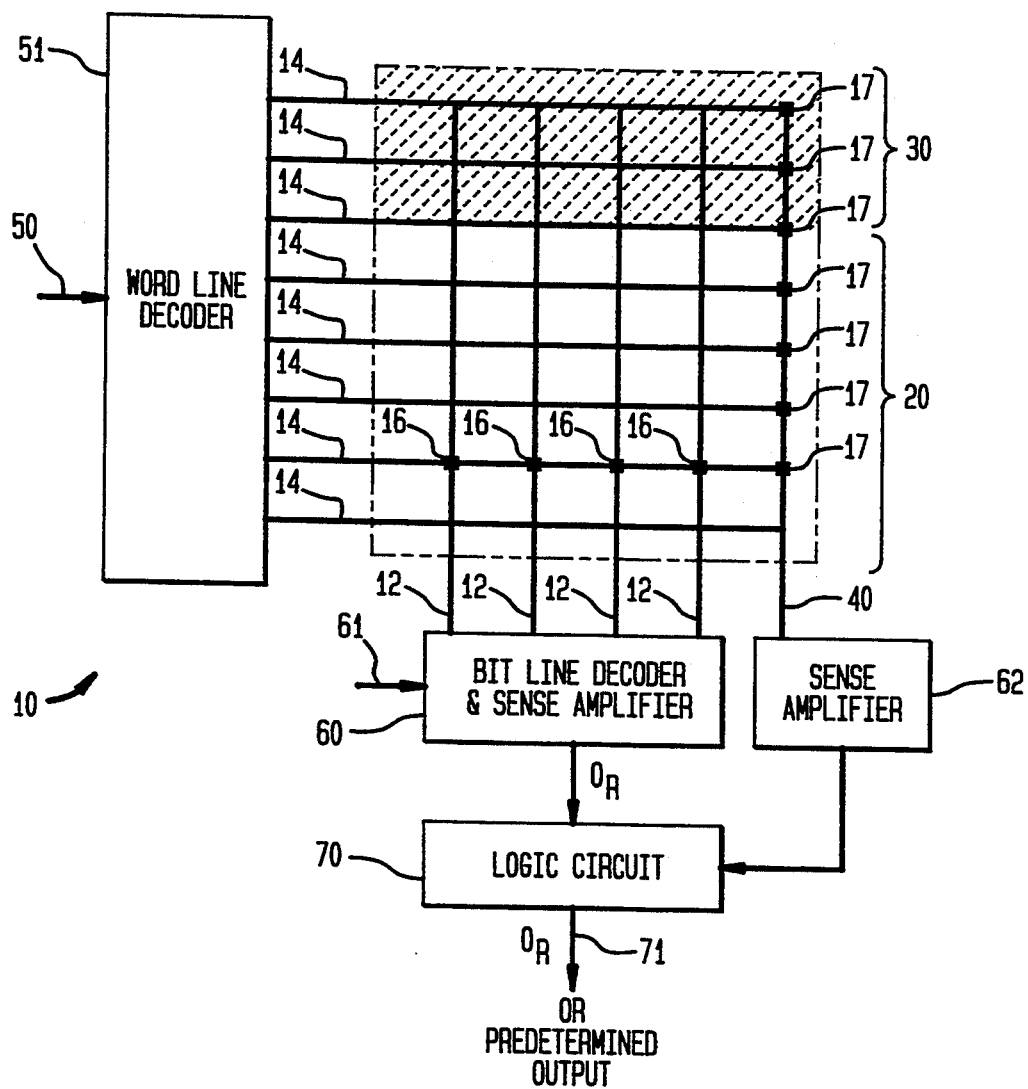
FIG. 1 schematically illustrates a ROM in accordance with the present invention.

A ROM in accordance with the present invention is illustrated in FIG. 1. The ROM 10 comprises a plurality of parallel bit lines 12 and a plurality of parallel word lines 14. The word lines 14 and bit lines 12 are oriented orthogonally to each other. A single bit storage location 16 is located at each intersection of a word line 14 and a bit line 12.

The ROM 10 is divided into a use area 20 and a no-use area 30. During the manufacture of the ROM, in the use area, each bit storage location 16 will be programmed with a logic 1 or logic 0 value in accordance with a program determined by the application for which the ROM is intended. During the manufacture, in the no-use area 30, each storage location should be given the same binary value. In practice, ROMs generally come in series of 8M, 16M, 32M, 64M, etc. In general, a customer does not use all of the locations and the larger the size of the ROM, the larger the size of the no-use area.

In the ROM of FIG. 1 each word line 14 in the no-use area 30 and the use area 20 contains a large number (e.g., 1028) bit storage locations 16. Those locations 16 in the use area 20 contain logic 1 and logic 0 values determined by the application. Those bit storage locations 16 in the no-use area 30 desirably all contain the same binary value, i.e., logic 1 or logic 0.

However, sometimes because of a defect, a bit storage location in the no-use area does not store the particular binary value assigned to it.

The ROM 10 of FIG. 1 also contains an additional bit line 40. There is a bit storage location 17 located at the intersection of each word line 14 and the extra bit line 40. This storage location stores a first binary value if the word line is in the no-use area 30 and a second binary value if the word line is in the use area 20.

The extra bit line 40 permits the no-use area 30 to be bypassed in a read operation. In a read operation, a word line 14 is selected by an address input 50 of a word line decoder 51. Each bit line 12 then takes on a particular output binary state (logic 1 or logic 0) depending on the logic value stored at the storage location at the intersection of the bit line and the selected word line. The logic level of the storage location is sensed through the bit line decoder and sense amplifier 60. In response to an address input 61, the bit line decoder outputs an eight-bit or a sixteen-bit output $O_R$. For example, if there are 1028 bit storage locations in the selected word line (and thus 1028 bit lines with binary output states), the input address 61 selects a particular eight-bit or sixteen-bit word as the output $O_R$. When the selected word line is in the no-use area 30 it is desired that the output $O_R$ always be 00 or FF for an eight-bit output or 0000 or FFFF for a sixteen-bit output.

The logic level of the extra bit line 40 is for example logic 1 if the selected word line is in a no-use area or logic 0 if the selected word line is in a use area. The output of the extra bit line 40 is transmitted to a logic circuit 70 via the sense amplifier 62. If the extra bit line is logic 0 (selected word line in use area) the real output $O_R$ of the ROM is transmitted to the output 71. However, if the extra bit line is logic 1 (selected word line is in the no-use area) the output of the, logic circuit 70 is always FF or 00 for an eight-bit output or FFFF or 0000 for a sixteen-bit output independent of the actual value of $O_R$.

In this way the actual values stored in the no-use area during reading are overridden. This permits a ROM having one or more defects at particular bit locations in the no-use area to be used in an application.

It should be noted that in some embodiments of the invention there is more than one extra bit line, such as the bit lines 40a and 40b shown in FIG. 2. Then instead of a single logic value controlling the logic circuit 70, a code formed from the output states of all the extra bit lines 40a and 40b are used to control the logic circuit 70. For example, if a no-use area comprises the left hand half 35 of a certain set of word lines, 14a there may be one extra bit line 40b for the right-hand side 25 of the ROM array and another extra bit line 40a for the left-hand side 35 of the ROM array. Then, an attempted read operation in a no-use area 35 will be indicated by a two-digit binary code given by the output state of the two extra bit lines 40a and 40b.

Finally, the above-described embodiments of the invention are intended to be illustrative only. Numerous alternative embodiments may be devised by those skilled in the art without departing from the spirit and scope of the following claims.

We claim:

1. A read only memory comprising:
   a main array of storage locations divided into a use area comprising particular storage locations for storing data for a particular application, and a no-use area comprising excess storage locations of said main array other than in said use area, wherein said no-use area is predetermined independently of the existence of defective storage locations therein,
   means for performing read operations in said use and said no-use areas of said array of storage locations, and
   means for overriding an output of each of said read operations in a storage location of said no-use area independently of the existence of a defective storage location in said no-use area and for outputting a predetermined value as data stored in said storage location of said no-use area, independently of the existence of a defective storage location of said no-use area.

2. The read only memory of claim 1 wherein each storage location is at the intersection of a word line and a bit line and wherein said means for performing a read operation comprises a word line decoder for selecting a particular word line along which a plurality of storage locations are located and a bit line decoder for detecting the output states of a set of bit lines in response to the selection of said particular word line.

3. The read only memory of claim 2 wherein said overriding means comprises at least one extra bit line coupled to each word line by an additional storage location, the output state of the extra bit line indicating whether or not at least a portion of said particular word line is in a no-use area.

4. A Read Only Memory integrated circuit comprising
   an array of data bit storage locations each located at the intersection of a word line and a bit line and being divided into a use area for storing user data and a no-use area,
   an additional bit line and an additional bit storage location at the intersection of said additional bit line and each of said word lines, each of said additional bit storage locations indicating if at least a portion of the corresponding word line is in said no-use or said use area,
   a word line decoder for selecting a word line during a read operation,
   a bit line decoder for detecting the states of said bit lines in said use area and no-use area during said read operation and for generating an actual output $0_R$ comprising one or more bits from said states of said bit lines, and
   logic means responsive to the state of said extra bit line for passing said actual output $0_R$ if said read operation is in a use area and for generating a predetermined output if said read operation is in a no-use area, thereby bypassing said no-use area during read operations.

5. The Read Only Memory integrated circuit of claim 4 wherein each of said additional bit storage locations indicates if an entire word line is in said use or no-use area.

6. The Read Only Memory integrated circuit of claim 4 wherein said Read Only Memory integrated circuit includes a plurality of extra bit lines and said logic means is responsive to said plurality of extra bit lines.

7. A read only memory comprising:
   an array of storage location divided into use and no-use areas,
   means for performing read operations in said use and no-use areas of said array of storage locations,
   means for overriding an output of one of said read operations and for outputting a predetermined value if said one read operation takes place in said no-use area of said array,
   wherein each storage location is at the intersection of a word line and a bit line,
   wherein said means for performing a read operation comprises a word line decoder for selecting a particular word line along which a plurality of storage locations are located and a bit line decoder for detecting the output states of a set of bit lines in response to the selection of said particular word line, and
   wherein said overriding means comprises at least one extra bit line coupled to each word line by an additional storage location, the output state of the extra bit line indicating whether or not at least a portion of said particular word line is in said no-use area.

* * * * *